United States Patent [19]
Sato

[11] Patent Number: 5,867,513
[45] Date of Patent: Feb. 2, 1999

[54] SEMICONDUCTOR LASER UNIT HAVING A FUNCTION OF STABILIZING AN OPTICAL OUTPUT AND A WAVELENGTH

[75] Inventor: Kazuyoshi Sato, Tokyo, Japan

[73] Assignee: NEC Corporation, Tokyo, Japan

[21] Appl. No.: 890,339

[22] Filed: Jul. 10, 1997

[30] Foreign Application Priority Data

Jul. 11, 1996 [JP] Japan ..................................... 8-182537
Sep. 30, 1996 [JP] Japan ..................................... 8-258670

[51] Int. Cl.$^6$ ........................................................ H01S 3/13
[52] U.S. Cl. ................................................. 372/32; 372/38
[58] Field of Search ................................ 372/32, 34, 36, 372/38

[56] References Cited

U.S. PATENT DOCUMENTS 5,410,515   4/1995   Bielas et al. ............................... 372/38

FOREIGN PATENT DOCUMENTS

| 62-136088 | 6/1987 | Japan . |
| 1-205486 | 8/1989 | Japan . |
| 1-238083 | 9/1989 | Japan . |
| 1-251681 | 10/1989 | Japan . |
| 2-244782 | 9/1990 | Japan . |
| 2-284487 | 11/1990 | Japan . |
| 7-249817 | 9/1995 | Japan . |
| 2 190 783 | 11/1987 | United Kingdom . |

OTHER PUBLICATIONS

European Search Report, dated Nov. 5, 1997.

*Primary Examiner*—Rodney Bovernick
*Assistant Examiner*—Robert E. Wise
*Attorney, Agent, or Firm*—Whitham, Curtis & Whitham

[57] ABSTRACT

A semiconductor laser unit includes a semiconductor laser device, a first temperature detector that detects a temperature in the vicinity of the semiconductor laser device, and an electronic cooler that heats or cools the semiconductor laser device. The semiconductor laser unit also includes first and second branching devices for extracting first and second branched lights from an oscillation light outgoing from the semiconductor laser device, a band pass filter that transmits only a light of a predetermined wavelength band among the first branched light, and an optical filter that transmits the second branched light so that a transmission loss is increased or decreased in one way with a change of the wavelength within a wavelength band where the oscillation wavelength of the semiconductor laser device can be changed, to output a second monitor light. The levels of lights which transmit each wavelength are transmitted are detected, respectively, and when the level of light that passes through the band pass filter is increased, a direction of changing the wavelength is detected according to an increase or decrease of the level of light that passes through the optical filter, and the temperature is changed by the electronic cooler to control the wavelength of the semiconductor laser device. Thus, both of the output level and the wavelength of the oscillation light from the semiconductor laser are stabilized.

13 Claims, 12 Drawing Sheets

SEMICONDUCTOR LASER UNIT HAVING A FUNCTION OF STABILIZING AN OPTICAL OUTPUT AND A WAVELENGTH

BACKGROUND OF THE INVENTION

1. Field of the Invention

The present invention relates to a semiconductor laser unit used for optical fiber communication and light measurement, and more particularly to a semiconductor laser unit having a function of stabilizing both of an optical output and an oscillation wavelength.

2. Description of the Related Art

A semiconductor laser unit used for optical communication, light measurement unit, etc., is required to stabilize an output of an outgoing light. In the conventional semiconductor laser unit, one light of lights outgoing in two directions, that is, forwardly and backwardly from the semiconductor laser device is detected by a photodiode, and a driving current which is supplied to the semiconductor laser device is controlled so that the quantity of one light is kept constant, to thereby stabilize the other outgoing light. In this method, even if the semiconductor laser device is deteriorated to the degree that the optical output of the semiconductor laser device is being lowered, the driving current can be controlled to be increased so that the optical output is kept constant.

Up to now, in order to control the temperature of the semiconductor laser, there have been frequently used a device that have combined an electronic cooler using the Peltier effect with a thermistor for detection of the temperature of a semiconductor laser section.

The semiconductor laser device is fixed to a heat sink which is fixed to a carrier by solder. The thermistor is fixed onto the carrier in the vicinity of the semiconductor laser device by solder. A photodiode (PD) is fixed onto the carrier by solder in such a manner that the light outgoing backwardly from the semiconductor laser device is input to the photodiode.

The electronic cooler is fixed to a base of a package at a lower side of a lower substrate thereof by solder. The carrier on which the semiconductor laser device, the thermistor and so on are mounted is fixed onto an upper surface of an upper substrate of the electronic cooler by solder.

In addition to the above basic structure, an automatic power control (hereinafter referred to as "APC") circuit and an automatic temperature control (hereinafter referred to as "ATC") circuit are normally connected to a semiconductor laser unit. The APC circuit that maintains the optical output of the semiconductor laser device constant controls an inrush current so that a light outgoing from the back side of the semiconductor laser device maintains the output of a light outgoing from the front side thereof constant.

The backward outgoing light is received by a photodiode (hereinafter referred to as "PD") and, is subjected to photoelectric conversion into a monitor current to input to the APC circuit. The APC circuit is designed to control the driving current supplied to the semiconductor laser device so that the quantity of a monitor current is kept constant, thereby keeping the forward outgoing light constant.

The thermistor is disposed in the vicinity of the semiconductor laser device to detect the temperature of the semiconductor laser device. The ATC circuit is designed to detect a resistant value of the thermistor, and to allow a current to flow into the electronic cooler so that the detected resistant value is made equal to a reference resistant value, thereby keeping the temperature of the semiconductor laser device constant. In the case where the temperature detected by the thermistor is higher than a set temperature, a current is allowed to flow into the electronic cooler in a direction where the thermistor is cooled. Reversely, in the case where the temperature detected by the thermistor is lower than the set temperature, the current is allowed to flow into the electronic cooler in another direction where the thermistor is heated. In the case where a difference between the temperature of the detected thermistor and the set temperature is large, the temperature is controlled so that a value of flowing current becomes large, whereas in the case where the difference between those temperatures is small, the temperature is controlled so that the current value becomes small. The characteristic of the optical output to the driving current of the semiconductor laser device is changed in accordance with the temperature, and a driving current value for obtaining a desired optical output increases as the temperature goes up. The oscillation wavelength is changed toward a long wavelength side as the driving current of the semiconductor laser device increases.

Because of those circuits, in the ATC circuit, even if the external environmental temperature of the semiconductor laser unit is changed, the temperature of the semiconductor laser device is kept constant. Therefore, in this state, if the driving current is constant, the oscillation wavelength of the semiconductor laser is kept constant. In the APC circuit, even if the semiconductor laser device is deteriorated so that the characteristic of the optical output to the driving current of the semiconductor laser device is changed, the driving current can be changed so that the monitor current of the PD is kept constant, and the optical output can be controlled to be kept constant.

As an oscillation wavelength stabilizing device of another semiconductor laser unit of this type, there is disclosed a technique in which a wavelength is controlled by detecting a wavelength through a light wavelength measuring unit, for example, in Japanese Patent Unexamined Publication No. Sho 62-136088. Japanese Patent Unexamined Publication No. Hei 1-1238083 discloses a technique in which a wavelength is detected by use of a gas cell and a photo detector. Japanese Patent Unexamined Publication No. Hei 2-284487 discloses a technique in which a light wavelength is controlled by use of a half-mirror, a ½ wavelength plate, a PBS, a wavelength selecting device and two PDs.

In recent years, there has been demanded a high-density wavelength multiplex system for super large capacity transmission or optical wave network. The respective semiconductor lasers used for light transmission at this time is required not only to stabilize an optical output but also to stabilize an oscillation wavelength. However, in the above-mentioned method of stabilizing the optical output by controlling the current, the driving current increases when the semiconductor laser is deteriorated. In this case, the oscillation wavelength is changed toward the long wavelength side with an increase of the current. In the case of conducting the wavelength multiple optical communication, a change of the wavelength causes cross-talk or the deterioration of the receive sensitivity, thus deteriorating the transmission characteristic.

In the technique in which the wavelength is controlled by detecting the wavelength using the light wavelength measuring unit as disclosed in Japanese Patent Unexamined Publication No. Sho 62-136088, and the technique in which the wavelength is controlled by use of the gas cell and the photo detector as disclosed in Japanese Patent Unexamined Publication No. Hei 1-1238083, there arises such a problem that the device is large-scaled. In the technique in which the light wavelength is controlled by use of the half-mirror, the ½ wavelength plate, the PBS, the wavelength selecting device and two PDs as disclosed in Japanese Patent Unexamined Publication No. Hei 2-284487, when the semiconductor laser is deteriorated so that the driving current is changed, the optical output and the wavelength cannot be stabilized simultaneously.

SUMMARY OF THE INVENTION

The present invention has been made in view of the above circumstances, and therefore an object of the present invention is to provide the structure of a downsized semiconductor laser unit which is capable of stabilizing an optical output and a wavelength simultaneously even if a semiconductor laser is deteriorated and a driving current is changed in the semiconductor laser unit.

In order to solve the above problems with the conventional semiconductor units, a semiconductor laser device according to the present invention includes: a semiconductor laser device; a terminal for supplying a current to the semiconductor laser; a first temperature detector for detecting a temperature in the vicinity of the semiconductor laser device; and an electronic cooler for heating or cooling the semiconductor laser device. The semiconductor laser unit further includes: a first branching device for extracting a first branched light from an oscillation light outgoing from the semiconductor laser device; a first optical filter that transmits only a light of a predetermined wavelength band among the first branched light to output a first monitor light; a first level detector for detecting a level of the first monitor light; a second branching device for extracting a second branched light from the oscillation light outgoing from the semiconductor laser device; a second optical filter that transmits the second branched light so that a transmission loss is increased or decreased in one way with a change of the wavelength within a wavelength band where the oscillation wavelength of the semiconductor laser device can be changed, to output a second monitor light; a second level detecting device for detecting a level of the second monitor light; and a third level detecting device which receives a third monitor light from the oscillation light to detect a level of the third monitor light.

Further, the semiconductor laser unit includes: an inrush current control circuit for controlling an inrush current so that the level of the third monitor light is kept constant; and a temperature control circuit for controlling the heating/cooling means so that the levels of the first monitor light and the second monitor light are kept constant.

In the semiconductor laser unit according to the present invention, the forward oscillation light outgoing from the front side of the semiconductor laser device among the oscillation lights is outputted to an optical fiber which is optically coupled to the semiconductor laser device, and the first branched light, the second branched light and the third monitor light are the backward oscillation lights outgoing from the back side of the semiconductor laser device among the oscillation lights.

The semiconductor laser unit further includes a lens that converges the backward oscillation light, which is disposed at the backward of the semiconductor laser device. The first branching device and the second branching device are dielectric light branch filters, respectively.

As another mode of the above example, the forward oscillation light outgoing from the front side of the semiconductor laser device among the oscillation light is outputted to an optical fiber which is optically coupled to the semiconductor laser device, and the first branched light, the second branched light and the third monitor light are parts of the forward oscillation light.

It is characterized that the first optical filter is a band pass filter, and the second optical filter is a short pass filter that increases its transmission loss more as a wavelength becomes long. In this case, the above temperature control circuit is characterized by controlling the electronic cooler in such a manner that the temperature is lowered when the level of the first monitor light increases more than a predetermined value, and the level of the second monitor light is lowered.

Reversely, the second optical filter may be made up of a long wave pass filter that reduces its transmission loss more as the wavelength becomes long. In this case, the temperature control circuit controls the electronic cooler in such a manner that the temperature goes up when the level of the first monitor light increases more than a predetermined value and the level of the second monitor light is lowered.

The electronic cooler is characterized by including a Peltier element. Also, each of the first branching devices and the second branching devices includes a ¼ λ plate that converts the first branched light and the second branched light to a circularly polarized light. Each of the first optical filter and the second optical filter includes a temperature stabilizing circuit that stabilizes their circumferential temperature.

More specially, the semiconductor laser unit according to the present invention includes: a semiconductor laser device; a first thermistor for detecting the temperature of the semiconductor laser device; a lens for converting one of lights outgoing in two ways from the semiconductor laser device to a parallel light; a first carrier on which the semiconductor laser device, the first thermistor and the lens are mounted; and a first electronic cooler for heating and cooling the semiconductor laser device and the first thermistor through the first carrier.

Also, the semiconductor laser unit according to the present invention includes: a first PBS that receives an incident light from the semiconductor laser device through the lens to separate a first outgoing light and second outgoing light; a first ¼ wavelength film disposed on an incident end surface of the first PBS for converting a linearly polarized light of the semiconductor laser device to a circularly polarized light; and a band pass filter film disposed on an outgoing end surface of the first PBS through which the separated first outgoing light passes, for allowing a light within a range of wavelengths that stabilize the oscillation wavelength of the semiconductor laser device to pass therethrough. The first outgoing light is input to the first PD.

Also, the semiconductor laser unit according to the present invention includes: a second PBS which receives the second outgoing light from the first PBS to separate the received light into a third outgoing light and a fourth outgoing light; a second ¼ wavelength film disposed on an incident end surface of the second PBS for converting the linearly polarized light which is the second outgoing light from the first PBS to a circularly polarized light; and a filter film disposed on a third incident end surface of the second PBS through which the separated third outgoing light passes, and having a primary loss characteristic with respect to wavelengths with a value of a wavelength that stabilizes the oscillation wavelength of the semiconductor laser device as a center. The third outgoing light is input to the second PD, and the fourth outgoing light is input to the third PD.

Further, the semiconductor laser unit according to the present invention includes: a second thermistor for detecting the temperature of the band pass filter film; and a second electronic cooler for heating and cooling the second thermistor, the first PBS, the second PBS, the first PD, the second PD and the third PD. The first electronic cooler and the second electronic cooler are fixed to a package, and a nitrogen gas is sealingly charged into the package, and a cover is joined to the package by seam welding or the like.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF THE PREFERRED EMBODIMENTS

First of all, before description of a semiconductor laser unit in accordance with the present invention, for facilitation of understanding the present invention, a conventional semiconductor laser unit will be described.

Figure 1:
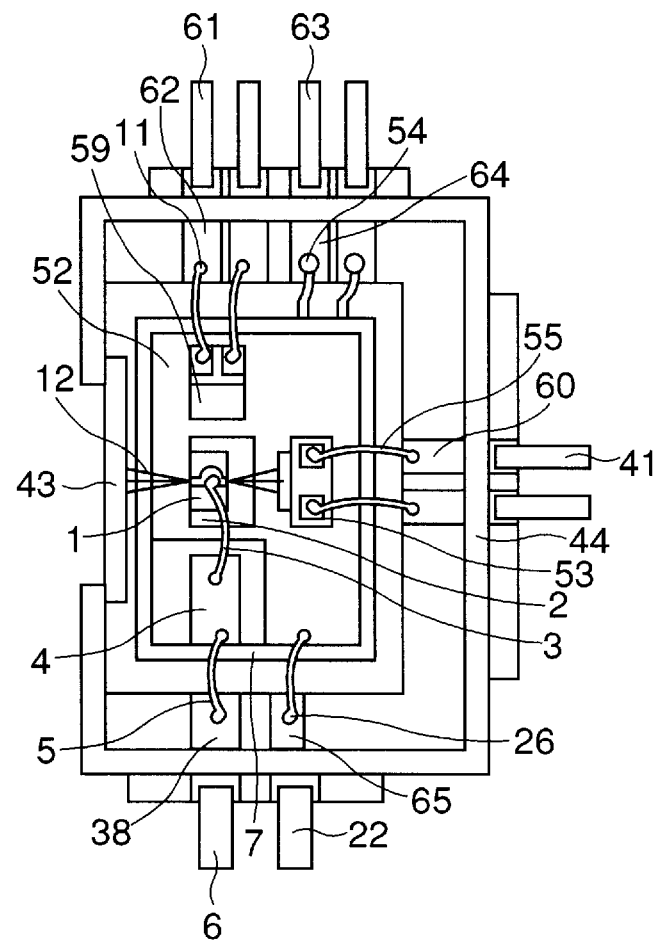
FIG. 1 is a top view showing an example of the structure of a conventional semiconductor laser unit.

FIG. 1 is a top view showing an example of the structure of a conventional semiconductor laser unit.

FIG. 1 shows an example of the structure of a semiconductor laser unit having the combination of an electronic cooler using a Peltier element and a thermistor for detection of the temperature of a semiconductor laser section, in order to control the temperature of the semiconductor laser.

As shown in FIG. 1, a semiconductor laser device 1 is fixed to a heat sink 2 by soldering (not shown). The heat sink 2 is fixed to a carrier 52 by soldering (not shown). A thermistor 59 is fixed onto the carrier 52 in the vicinity of the semiconductor laser device 1 by soldering (not shown). A PD 53 is fixed onto the carrier 52 by soldering (not shown) in such a manner that a backward outgoing light 3 from the semiconductor laser device 1 is input to the PD 53.

Figure 2:
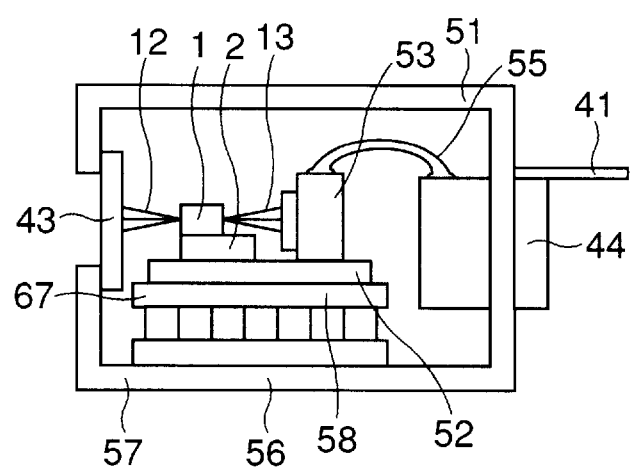
FIG. 2 is a vertical cross-sectional view showing an example of the structure of the conventional semiconductor laser unit.

As shown in FIG. 2, an electronic cooler 67 is fixed onto a base 57 of a package 44 by soldering (not shown). The carrier on which the semiconductor laser device 1, the thermistor and so on are mounted is fixed onto an upper side of an upper substrate 58 of the electronic cooler 67 by soldering (not shown).

As shown in FIG. 1, an electrode on the upper surface of the semiconductor laser device 1 and a bias line pattern 4 are electrically connected to each other through a bonding wire 3. The bias line pattern 4 and a wiring pattern 38 on the package 44 side are electrically connected to each other through a bonding wire 5, and then connected to a lead 6 on the exterior of the package 44. On the other hand, an electrode on a lower surface of the semiconductor laser device 1 is electrically connected to the heat sink 2. The heat sink 2 is electrically connected to an upper surface of the carrier 52. The upper surface of the carrier 52 and the wiring pattern 65 on the package 44 side are electrically connected to each other through an bonding wire 26, and then connected to a lead 22 on the exterior of the package 44. The thermistor 59 and a wiring pattern 62 on the package 44 side are electrically connected to a bonding wire 11, and then connected to a lead 61 on the exterior of the package 44. The PD 53 and a wiring pattern 60 on the package 44 side are electrically connected to each other through a bonding wire 55, and then connected to a lead 41 on the exterior of the package 44.

A lead 54 of the electronic cooler and a wiring pattern 64 on the package 44 side are electrically connected to each other, and then connected to a lead 63 on the exterior of the package 44. After the above-mentioned parts are mounted, as shown in FIG. 2, a nitrogen gas is sealingly inserted into the package 44, and then the cover 51 is joined to the package 44 by seam welding or the like.

Figure 3:
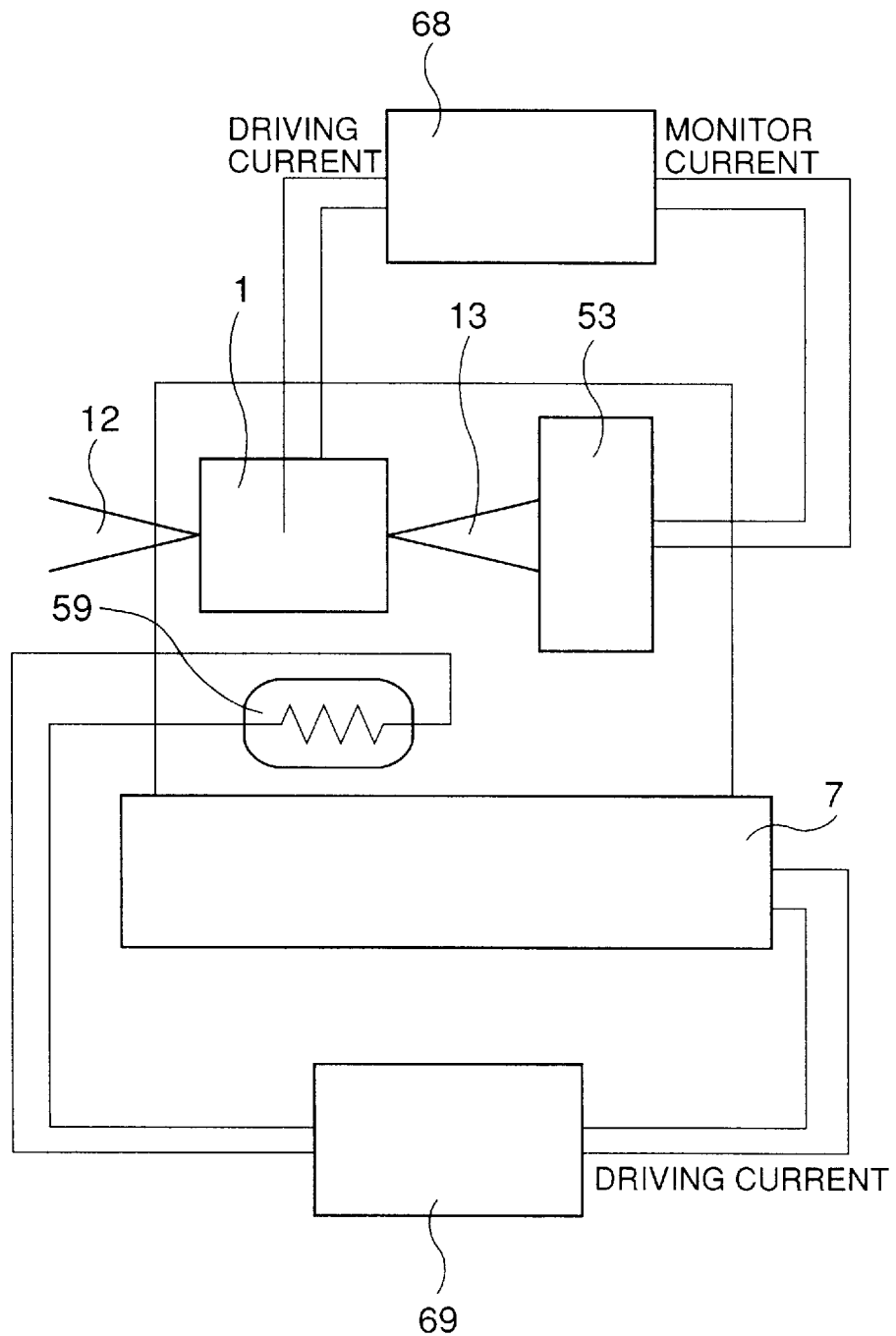
FIG. 3 is a block diagram showing an APC circuit and an ATC circuit used in the conventional semiconductor laser unit.

FIG. 3 is a block diagram showing a structure in which the conventional automatic power control (hereinafter referred to as "APC") circuit and the conventional automatic temperature control (hereinafter referred to as "ATC") circuit are connected to the semiconductor laser unit in accordance with an embodiment of the present invention.

First, a description will be given of an APC circuit 68 that holds the optical output of the semiconductor laser device constant. A beam is made outgoing from both end surfaces of the semiconductor laser device 1 toward the right and left sides in the figure. A backward outgoing light 13 on the right side in the figure is used in the APC circuit that maintains the output of forward outgoing light 12 on the left side constant. The backward outgoing light 13 is received by a photodiode (hereinafter referred to as "PD") 53, converted into a monitor current, and then inputted to the APC circuit 68. The APC circuit 68 controls a driving current which is supplied to the semiconductor laser device 1 so that the quantity of monitor current is kept constant, whereby the forward outgoing light 12 is kept constant.

Hereinafter, a description will be given of the ATC circuit 69 that controls the temperature of the semiconductor laser device 1.

The thermistor 59 is disposed in the vicinity of the semiconductor laser device 1 for detecting the temperature of the semiconductor laser device 1. In the ATC circuit 69, a resistant value of the thermistor 59 is detected, and a current is allowed to flow in the electronic cooler 67 so that the resistant value is equal to a reference resistant value, thereby keeping the temperature of the semiconductor laser device 1 constant. In the case where the temperature detected by the thermistor 59 is higher than a set temperature, the current is allowed to flow in the electronic cooler 67 toward a direction for cooling the thermistor 59. On the contrary, in the case where it is lower than the set temperature, the current is allowed to flow in the electronic cooler 67 toward a direction for heating the thermistor 59.

In the case where a difference between the detected temperature of the thermistor 59 and the set temperature is large, the temperature is controlled such that a current value that flows in the electronic cooler 67 is large, whereas in the case where the difference in temperature is small, the temperature is controlled such that the current value is small. The characteristic of the optical output to the driving current of the semiconductor laser device changes according to temperature in such a manner that the driving current value for obtaining a desired optical output increases more as the temperature goes up. As the driving current of the semiconductor laser device increases, the oscillation wavelength is changed toward a long wavelength side.

With the above circuits, in the ATC circuit 69, even though the external environmental temperature of the semiconductor laser unit is changed, the temperature of the semiconductor laser device 1 is kept constant. Therefore, in this situation, if the driving current is kept constant, the oscillation wavelength of the semiconductor laser is kept constant. In the APC circuit 68, even though the semiconductor laser device is deteriorated to the degree that the characteristic of the optical output with respect to the driving current of the semiconductor laser device is changed, the driving current can be changed so that the monitor current of the PD is kept constant. As a result, the optical output can be controlled to be kept constant.

In the above-mentioned method of stabilizing the optical output under current control, when the semiconductor laser is deteriorated, the driving current increases. In this state, the oscillation wavelength is also changed toward the long wavelength side with an increase of current. In particular, in the case of conducting a wavelength multiplex optical communication, the change of the wavelength causes crosstalk or the deterioration of a receive sensitivity, with the result that the transmission characteristic is deteriorated.

Subsequently, the semiconductor laser unit according to the present invention will be described in more detail with reference to the accompanying drawings.

Figure 4:
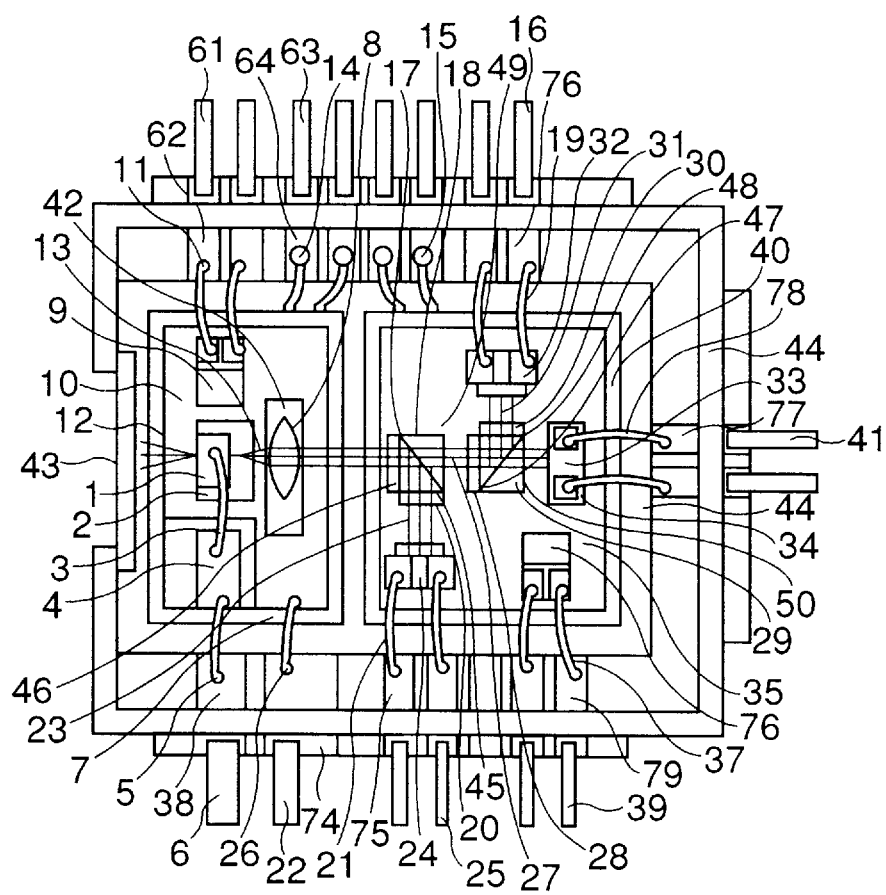
FIG. 4 is a top view showing the structure of a semiconductor laser unit according to an embodiment of the present invention.

FIG. 4 is a diagram showing a semiconductor laser unit in accordance with an embodiment of the present invention.

First, the periphery of a first electronic cooler 7 will be described. A semiconductor laser device 1 is fixed to a heat sink 2 by soldering (not shown). The heat sink 2 is fixed to a carrier 52 by soldering (not shown). A first thermistor 9 is fixed onto a first carrier 10 in the vicinity of the semiconductor laser device 1 by soldering (not shown). A lens 8 is adjusted to convert a backward outgoing light 13 of lights outgoing in two ways from the semiconductor laser device 1 into a parallel light, and is fixed to a lens holder 42 that is fixed to the first carrier 10.

Figure 5:
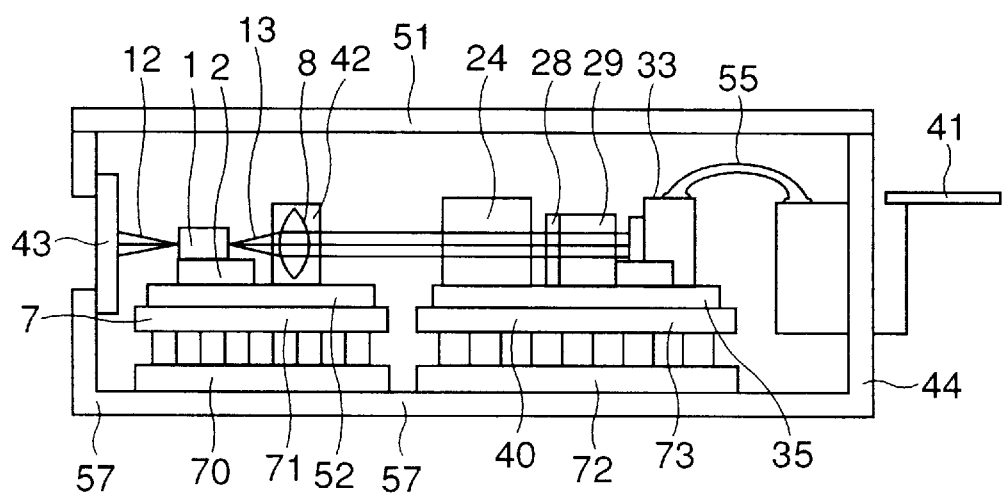
FIG. 5 is a virtical cross-sectional view showing the structure of a semiconductor laser unit according to the embodiment of the present invention.

As shown in FIG. 5, the first electronic cooler 7 is fixed to a base 57 of a package 44 at a lower side of a first lower substrate 70 by soldering (not shown). The first carrier 10 on which the semiconductor laser device 1, the first thermistor 9 and so on are mounted is fixed onto an upper side of a first upper substrate 71 of the first electronic cooler 7 by soldering (not shown).

As shown in FIG. 4, an electrode on the upper surface of the semiconductor laser device 1 and a bias line pattern 4 are electrically connected to each other through a bonding wire 3. The bias line pattern 4 and a wiring pattern 38 on the package 44 side are electrically connected to each other through a bonding wire 5, and then connected to a lead 6 on the exterior of the package 44. On the other hand, an electrode on a lower surface of the semiconductor laser device 1 is electrically connected to the heat sink 2. The heat sink 2 is electrically connected to an upper surface of the carrier 52. The upper surface of the first carrier 10 and a wiring pattern 74 on the package 44 side are electrically connected to each other through an bonding wire 26, and then connected to a lead 22 on the exterior of the package 44. The first thermistor 9 and a wiring pattern 62 on the package 44 side are electrically connected to a bonding wire 11, and then connected to a lead 61 on the exterior of the package 44. A lead 14 of the first electronic cooler 7 and a wiring pattern 64 on the package 44 side are electrically connected to each other, and then connected to a lead 63 on the exterior of the package 44.

Subsequently, the periphery of a second electronic cooler 40 will be described.

A light from the semiconductor laser device 1 through the lens 8 is input to a first ¼ wavelength film 17 provided on an incident end surface 46 of a first PBS 18. The incident light, after being converted from a linearly polarized light of the semiconductor laser device 1 to a circularly polarized light, is input to the first PBS 18. The incident light is split into a first outgoing light 23 and a second outgoing light 27 by the first PBS 18.

Figure 6:
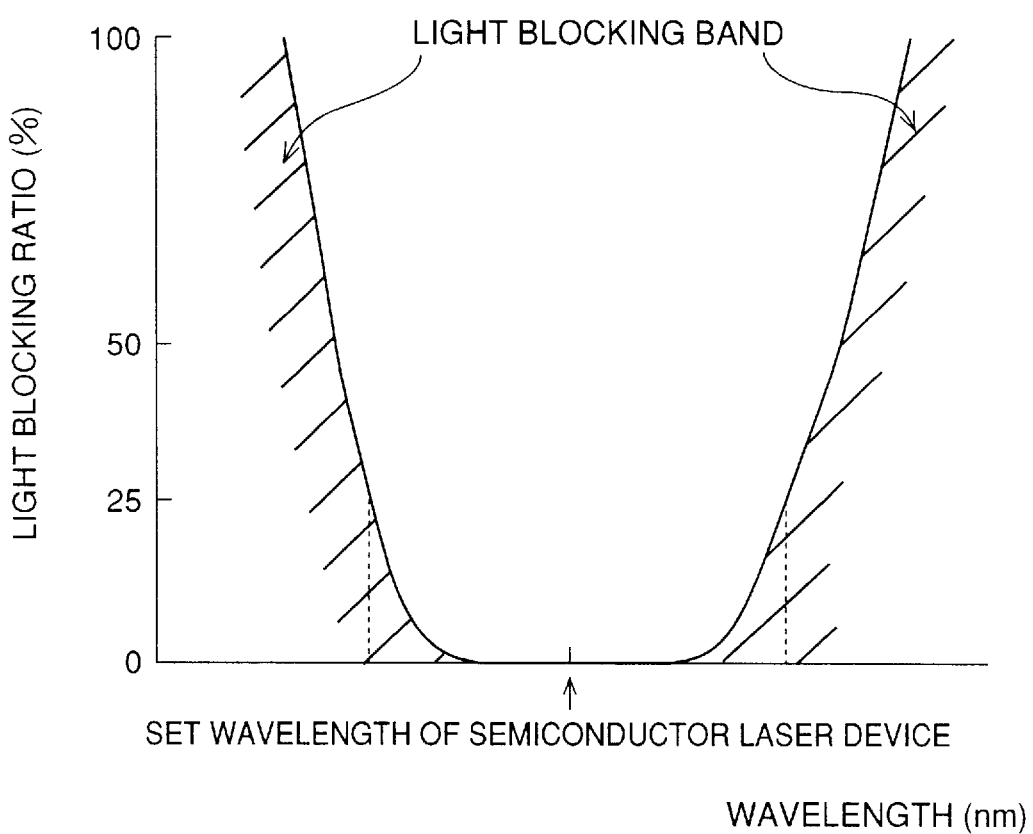
FIG. 6 is a graph representing the waveform characteristic of a band pass filter used in the semiconductor laser unit according to the embodiment of the present invention.

An outgoing end surface 45 of the first PBS 18 through which the first outgoing light 23 passes is provided with a band pass filter film 20. The first outgoing light 23 that has passed through the band pass filter film 20 is input to a first PD 24. An example of the light blocking characteristic of the band pass filter film 20 with respect to wavelengths is shown in FIG. 6. In the band pass filter film, wavelengths are set so that the ratio of light blocking is the smallest at the center value of wavelengths that stabilize the oscillation wavelength of the semiconductor laser device 1.

Figure 7:
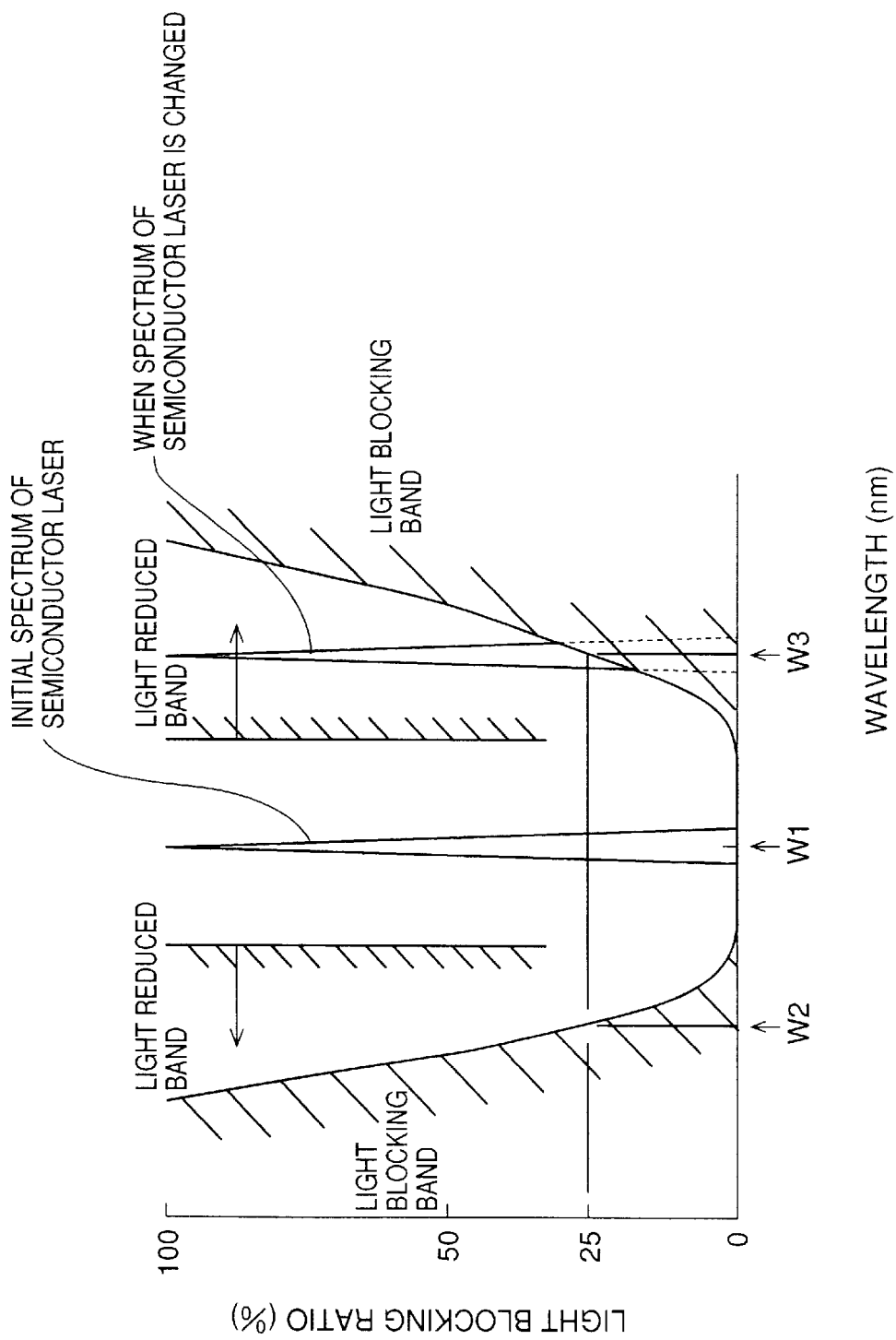
FIG. 7 is a graph representing a state in which the wavelength characteristic of the band pass filter and the oscillation wavelength of a semiconductor laser device used in the semiconductor laser unit according to the embodiment of the present invention are changed.

As shown in FIG. 7, when the oscillation wavelength of the semiconductor laser device 1 is shifted from an initial value W1 to, for example, W3, and then enters a light blocking band of the band pass filter film, the quantity of light received by the first PD 24 is reduced. When the oscillation wavelength of the spectrum of the semiconductor laser device 1 is changed from W1 to W3, the quantity of light received by the first PD 24 is reduced to 75%. In this example, the semiconductor laser device 1 is a DFB (distributed feedback) laser that conducts mono-axial mode oscillations. Also, in this example, a band of wavelengths that stabilize the semiconductor laser device 1 is set to W2 to W3, and a change in the quantity of light received by the first PD that detects a change in wavelength is set to 75% of the initial value.

The second outgoing light 27 from the first PBS 18 is input to a second ¼ wavelength film 2 provided on an incident surface 47 of a second PBS 29, and the second outgoing light 27 is input to the second PBS 29 after having being converted from a linearly polarized light to a circularly polarized light. The incident light is split into a third outgoing light 31 and a fourth outgoing light 34. A third outgoing end surface 48 of the second PBS 29 through which the split third outgoing light 31 passes is provided with a filter film 30 having a linear loss characteristic with respect to the wavelengths with a wavelength that stabilizes the oscillation wavelength of the semiconductor laser device 1 as a center thereof. The third outgoing light 31 is input to the second PD 32.

Figure 8:
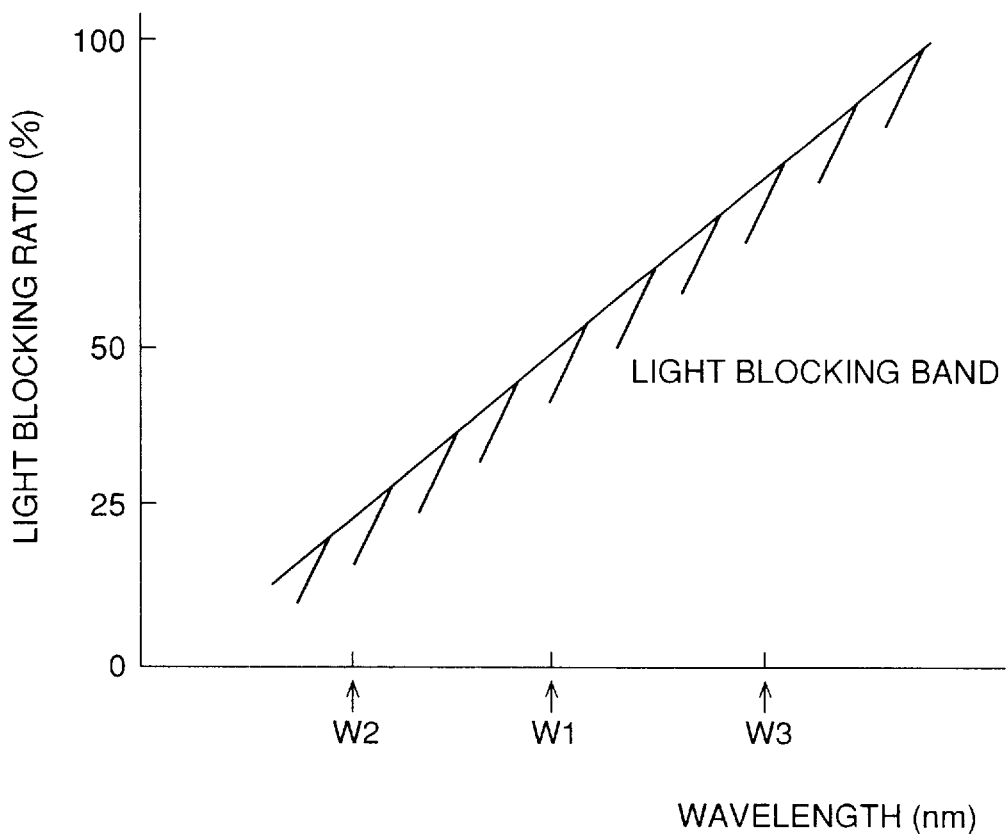
FIG. 8 is a graph representing the wavelength characteristic of an optical filter used in the semiconductor laser unit according to the embodiment of the present invention.
Figure 9:
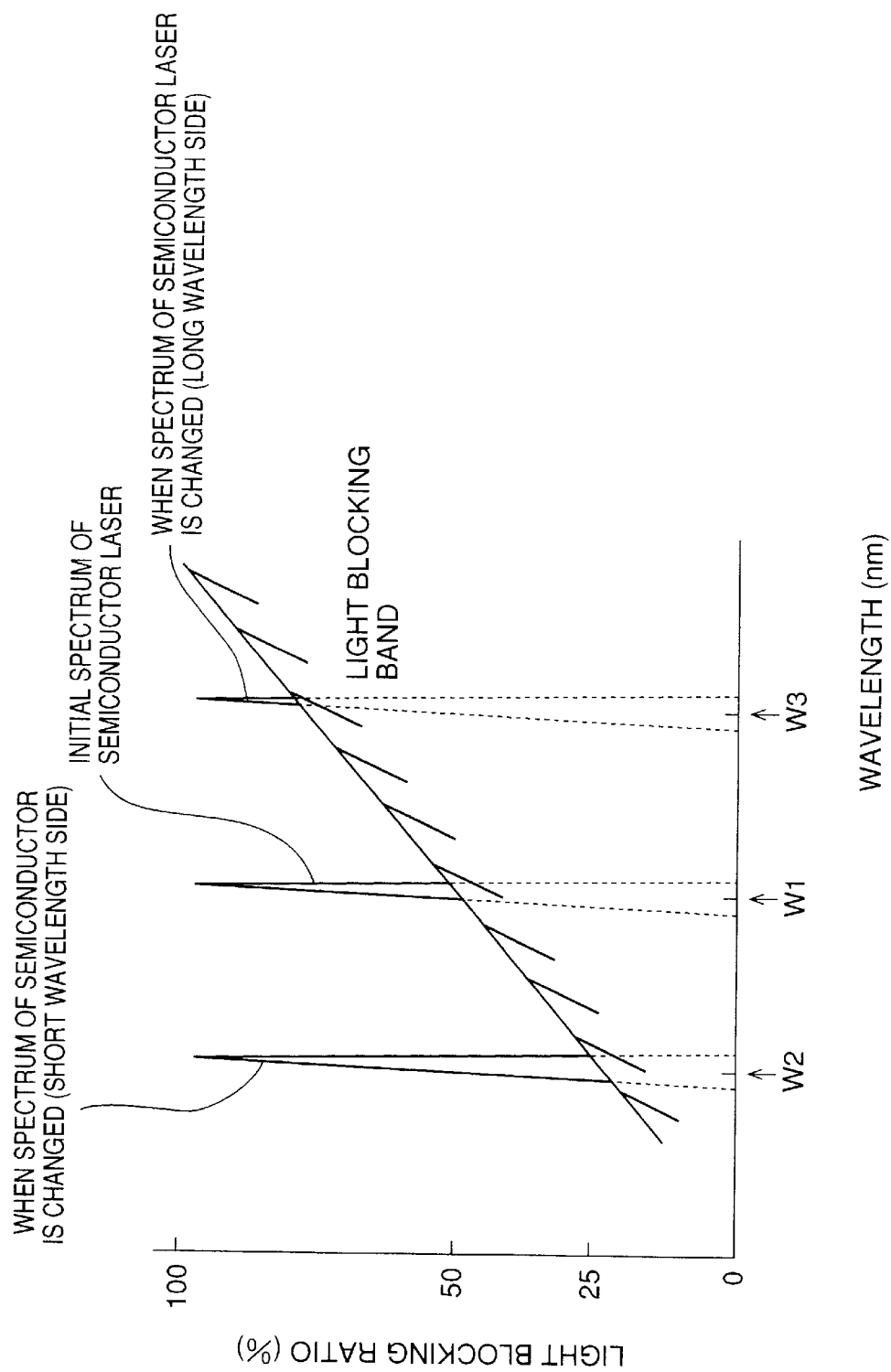
FIG. 9 is a graph representing a state in which the wavelength characteristic of the optical filter and the oscillation wavelength of the semiconductor device used in the semiconductor laser unit according to the embodiment of the present invention are changed.

An example of the light blocking characteristic of the filter film 30 with respect to wavelengths is shown in FIG. 8. In the filter film, wavelengths are set so that the ratio of light blocking is 50% at the center value of wavelengths that stabilize the oscillation wavelength of the semiconductor laser device 1. As shown in FIG. 9, when the oscillation wavelength of the semiconductor laser device 1 is shifted from an initial value W1 to, for example, W3, the quantity of light received by the second PD 32 is reduced to approximately ½ of the initial value. The fourth outgoing light 34 is input to the third PD 33.

Further, as shown in FIG. 5, the second electronic cooler 40 is fixed to the base 57 of the package 44 at a lower side of a second lower substrate 72 by soldering (not shown). A second thermistor 36 for detecting the temperature of the band pass filter film 20, and a second carrier 35 on which the second thermistor 36, the first PBS 18, the second PBS 29, the first PD 24, the second PD 32 and the third PD 33 are mounted is fixed onto an upper side of a second upper substrate 73 of the second electronic cooler 40 by soldering (not shown).

As shown in FIG. 5, the first PD 24 and a wiring pattern 75 on the package 44 side are electrically connected to each other through a bonding wire 21, and then connected to a lead 25 on the exterior of the package 44. The second PD 32 and a wiring pattern 76 are electrically connected to each other through a bonding wire 19, and then connected to a lead 46. The third PD 33 and a wiring pattern 77 are electrically connected to each other through a bonding wire 78, and then connected to a lead 16. Further, the second thermistor 36 and a wiring pattern 79 on the package 44 side are electrically connected to each other through a bonding wire 37.

After the above-mentioned parts are mounted, a nitrogen gas is sealingly inserted into the package 7, and then a cover 55 is joined to the package 7 by seam welding or the like.

Figure 10:
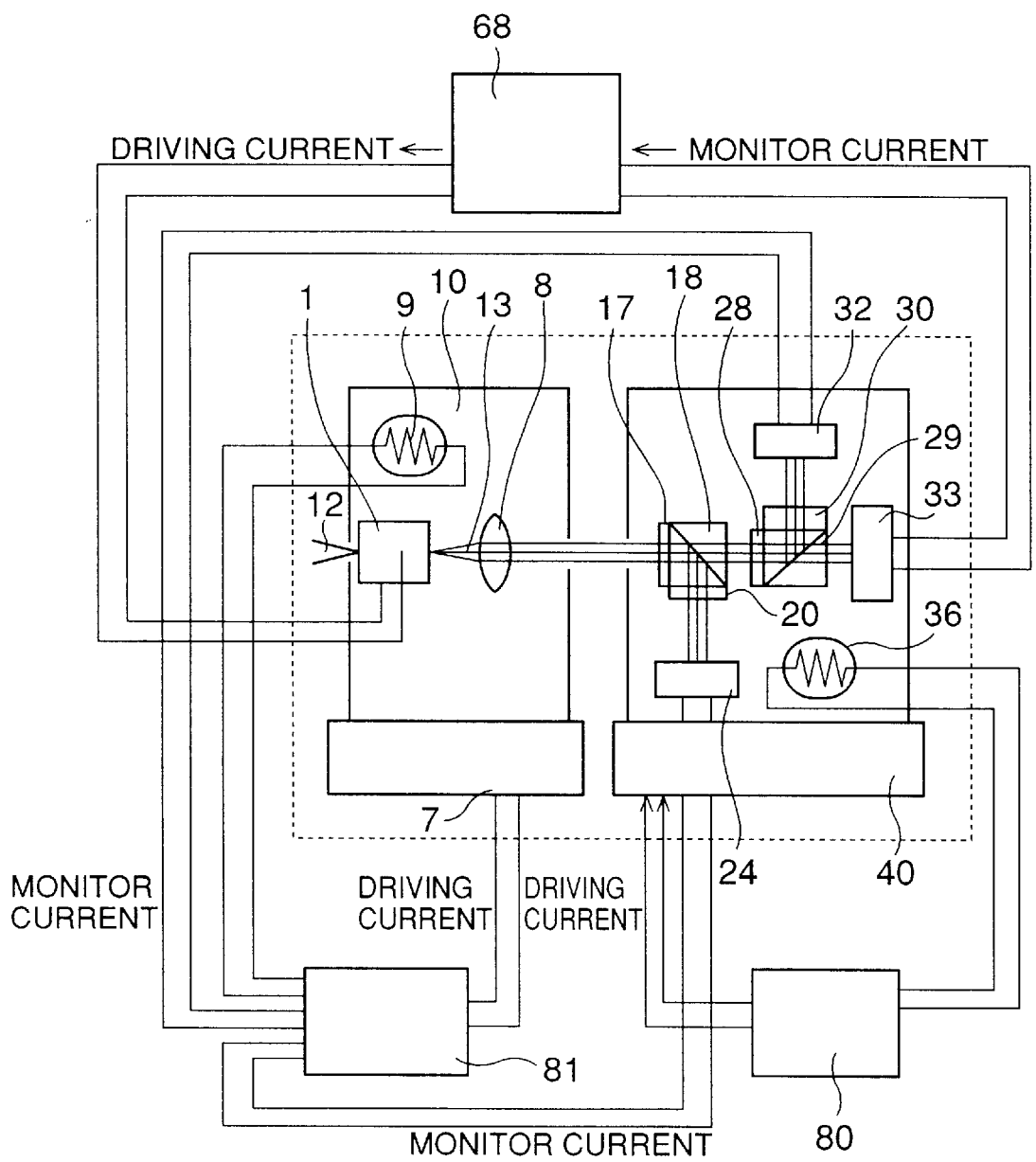
FIG. 10 is a diagram showing a structure including an AFC circuit and an APC circuit in the semiconductor laser unit according to the embodiment of the present invention.
Figure 11:
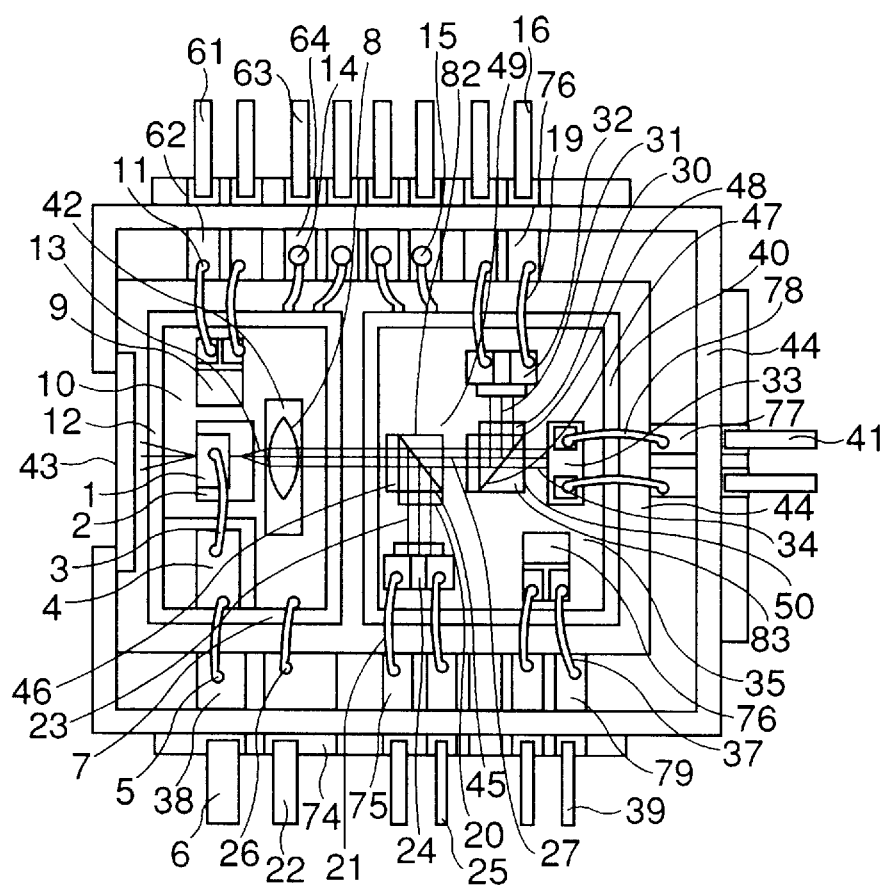
FIG. 11 is a top view showing the structure of a semiconductor laser unit according to an embodiment of the present invention shown in FIG. 10.
Figure 12:
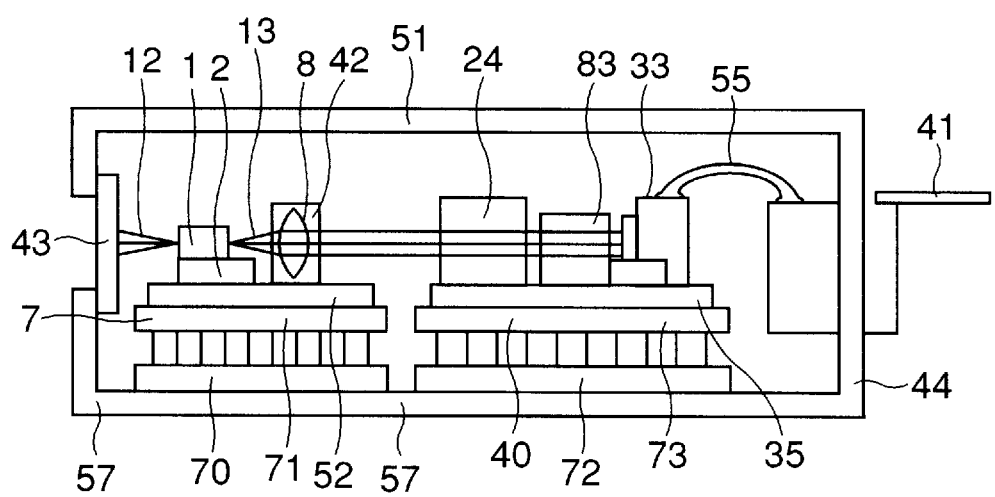
FIG. 12 is a virtical cross-sectional view shoeing the structure of a semiconductor laser unit according to an embodiment of the present invention shown in FIG. 10.

FIG. 10 is a block diagram showing a structure in which an AFC (automatic frequency control) circuit, an APC circuit and an ATC circuit are connected to a semiconductor laser unit of the embodiment of the present invention in accordance with another embodiment of the present invention. FIGS. 11 and 12 are a top and a virtical cross-sectional views showing the structure shown in FIG. 10, respectively.

First of all, a description will be given of an AFC circuit 81 that controls the wavelength of the semiconductor laser device 1. As was already described with reference to FIG. 7, when the oscillation wavelength of the semiconductor laser device 1 is shifted from the initial value W1 to, for example, W3 (or W2) so as to enter the light blocking band of the band pass filter film 20, the quantity of light received by the first PD 24 is reduced. It is found from a threshold value for detection of a change in wavelength that when a change in the quantity of light received by the first PD 24 is reduced to 75%, the oscillation wavelength of the semiconductor laser device 1 which is detected by the first PD 24 is W2 or W3.

As shown in FIG. 9, in the case where the quantity of light received by the second PD 32 is reduced to approximately ½, it is found that the oscillation wavelength of the semiconductor laser device 1 is shifted from the initial value W1 to W3. Also, in the case where the quantity of light received by the second PD 32 is increased to approximately ⅔, it is found that the oscillation wavelength of the semiconductor laser device 1 is shifted from the initial value W1 to W2. The oscillation wavelength of the semiconductor laser device 1 has a temperature characteristic such that it is changed toward a long wavelength side as the temperature goes up, but it is changed toward a short wavelength side as the temperature goes down reversely. Therefore, the oscillation wavelength can be controlled within a desired range in such a manner that the electronic cooler 7 allows the temperature of the semiconductor laser device 1 to go down when the wavelength is changed to W3 of the long wavelength side, and to go up when the wavelength is changed to W2 of the short wavelength side. Also, the APC circuit 68 controls the driving current which is supplied to the semiconductor laser device 1 so that the monitor current of the third PD 33 is kept constant, thereby being capable of controlling the forward outgoing light 12 to be kept constant.

The light blocking characteristic of the band pass filter film 20 and the filter film 30 with respect to wavelengths are changed when temperature is changed. In order to restrain this change to operate the AFC circuit normally, the temperatures of the band pass filter film 20 and the filter film 30 are first detected by a resistant value of the second thermistor 36. A current is allowed to flow into the second electronic cooler 40 in such a manner that the resistant value is equal to the reference resistant value, with the result that the temperatures of the band pass filter film 20 and the filter film 30 are controlled to be kept constant.

It should be noted that although the backward outgoing light 13 from the semiconductor laser device 1 is converted into a parallel light by the lens 8 in this embodiment, it may be converted into a convergent light. Also, although the semiconductor laser device 1 is made up of the DFB laser that conducts the mono-axial mode oscillations in this embodiment, it may be made up of a DBR (distributed brag reflector) laser, or the like. If the width of wavelength is narrower than the width of the light blocking band of the band pass filter film 20, it may be an FP (fabry-perot) laser. Although it was described that a change in the quantity of light received by the first PD that detects a change in the wavelength of the semiconductor laser device 1 was 75% of the initial value, the change is not limited to or by this.

Although the example of the characteristic of the band pass filter film is shown in FIGS. 6 and 7, it is not limited to or by this. Also, although the example of the characteristic of the filter film is shown in FIGS. 8 and 9, it is not limited to this, and it is essential that the characteristic goes upward or downward toward the right within a range of the detected wavelength.

As was described above, according to the present invention, the semiconductor laser unit has not only a function of detecting the optical output of the semiconductor laser but also a function of detecting whether the oscillation wavelength exceeds the wavelengths within a range that stabilizes the oscillation wavelength of the semiconductor laser device, or not, and also a direction along which the wavelength is changed. In the case where the oscillation wavelength exceeds a desired range of wavelengths, the temperature of the semiconductor laser is changed by the first electronic cooler, thereby being capable of changing the wavelength to a desired value. As a result, even though the semiconductor laser is deteriorated to the degree that the driving current is changed, the optical output and the wavelength can be stabilized simultaneously.

While this invention has been described in connection with certain preferred embodiments, it is to be understood that the subject matter encompassed by way of this invention is not limited to those specific embodiments. On the contrary, it is intended for the subject matter of the invention to include all alternative, modification and equivalents as can be included within the spirit and scope of the following claims.

What is claimed is:

1. A semiconductor laser device, comprising:

a semiconductor laser device;

current rushing means for rushing a current to said semiconductor laser;

temperature detecting means for detecting a temperature in the vicinity of said semiconductor laser device;

heating and cooling means for heating or cooling said semiconductor laser device;

first branch means for extracting a first branched light from an oscillation light outgoing from said semiconductor laser device;

first wavelength selecting means for transmitting only a light of a predetermined wavelength band among said first branched light to output a first monitor light;

first level detecting means for detecting a level of said first monitor light;

second branch means for extracting a second branched light from the oscillation light outgoing from said semiconductor laser device;

second wavelength selecting means for transmitting said second branched light so that a transmission loss is increased or decreased in one direction with a change of the wavelength within a wavelength band where said oscillation wavelength can be changed, to output a second monitor light;

second level detecting means for detecting a level of said second monitor light; and third level detecting means for receiving a third monitor light from said oscillation light to detect a level of said third monitor light.

2. A semiconductor laser unit as claimed in claim 1, further comprising:

inrush current control circuit for controlling said inrush current so that the level of said third monitor light is kept constant; and temperature control means for controlling said heating and cooling means so that the levels of said first monitor light and said second monitor light are kept constant.

3. A semiconductor laser unit as claimed in claim 2, wherein the forward oscillation light outgoing from the front side of said semiconductor laser device among said oscillation lights is outputted to an optical fiber which is optically coupled to said semiconductor laser device; and wherein said first branched light, said second branched light and said third monitor light are the backward oscillation lights outgoing from the back side of said semiconductor laser device among said oscillation lights.

4. A semiconductor laser unit as claimed in claim 3, further comprising light converging means for converging said backward oscillation light, which is disposed at the back of said semiconductor laser device;

wherein said first branch means and said second branch means are dielectric light branch filters, respectively.

5. A semiconductor laser unit as claimed in claim 4, wherein said first wavelength selecting means is a band pass filter.

6. A semiconductor laser unit as claimed in claim 5, wherein said second wavelength selecting means is a long wave pass filter that reduces its transmission loss more as the wavelength becomes long.

7. A semiconductor laser unit as claimed in claim 4, wherein said second wavelength selecting means is a short pass filter that increases its transmission loss more as a wavelength becomes long.

8. A semiconductor laser unit as claimed in claim 7, wherein said temperature control means controls said heating and cooling means in such a manner that said temperature goes down when the level of said first monitor light increases more than a predetermined value, and the level of said second monitor light is lowered.

9. A semiconductor laser unit as claimed in claim 7, wherein said temperature control means controls said heating and cooling means in such a manner that said temperature goes up when the level of said first monitor light increases more than a predetermined value and the level of said second monitor light is lowered.

10. A semiconductor laser unit as claimed in claim 2, wherein the forward oscillation light outgoing from the front side of said semiconductor laser device among said oscillation lights is outputted to an optical fiber which is optically coupled to said semiconductor laser device; and wherein said first branched light, said second branched light and said third monitor light are parts of said forward oscillation lights.

11. A semiconductor laser unit as claimed in claim 2, wherein said heating and cooling means includes a Peltier element.

12. A semiconductor laser unit as claimed in claim 2, wherein each of said first branching means and said second branching means includes a ¼ λ plate that converts said first branched light and said second branched light to a circularly polarized light.

13. A semiconductor laser unit as claimed in claim 2, wherein each of said first wavelength selecting means and said second wavelength selecting means includes a temperature stabilizing means that stabilizes their circumferential temperature.

* * * * *